(12) United States Patent
Koch et al.

(10) Patent No.: US 8,198,864 B2
(45) Date of Patent: Jun. 12, 2012

(54) METHOD AND SYSTEM FOR DETERMINING A STATE OF CHARGE OF A BATTERY

(75) Inventors: Brian J. Koch, Berkley, MI (US); Robert S. Conell, Sterling Heights, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 1143 days.

(21) Appl. No.: 11/935,120

(22) Filed: Nov. 5, 2007

(65) Prior Publication Data

US 2009/0115420 A1  May 7, 2009

(51) Int. Cl.
*H02J 7/00* (2006.01)
*G01R 33/02* (2006.01)
*G01B 7/14* (2006.01)
*G01B 7/30* (2006.01)
*H01L 43/08* (2006.01)
*G01N 27/416* (2006.01)
*H01M 2/00* (2006.01)

(52) U.S. Cl. ... 320/132; 324/432; 324/244; 324/207.21; 324/260; 429/10

(58) Field of Classification Search ............ 320/132, 320/134, 104; 324/432, 301, 331, 389, 200, 324/205, 207.21, 207.2, 219, 201, 244, 260, 324/262; 429/10; 702/63
See application file for complete search history.

(56) References Cited

U.S. PATENT DOCUMENTS

| | | | |
|---|---|---|---|
| 6,639,385 B2 | 10/2003 | Verbrugge et al. | |
| 7,489,108 B2 * | 2/2009 | Matsumoto et al. | 320/132 |
| 2003/0178970 A1 * | 9/2003 | Minamiura et al. | 320/116 |
| 2004/0026142 A1 * | 2/2004 | Schmitz et al. | 180/65.3 |
| 2006/0076929 A1 * | 4/2006 | Tatsumi et al. | 320/132 |
| 2006/0132141 A1 * | 6/2006 | Dougherty et al. | 324/435 |

\* cited by examiner

*Primary Examiner* — Melissa Koval
*Assistant Examiner* — Alexis Boateng
(74) *Attorney, Agent, or Firm* — Ingrassia Fisher & Lorenz P.C.

(57) ABSTRACT

Methods and systems are provided for determining a state of charge of a battery. A magnetic force between the battery and a magnet is detected. The state of charge of the battery is determined based on the detected magnetic force.

18 Claims, 4 Drawing Sheets

METHOD AND SYSTEM FOR DETERMINING A STATE OF CHARGE OF A BATTERY

TECHNICAL FIELD

The present invention generally relates to electrochemical power sources, such as batteries, and more particularly relates to a method and system for determining the state of charge of a battery.

BACKGROUND OF THE INVENTION

In recent years, advances in technology, as well as ever-evolving tastes in style, have led to substantial changes in the design of automobiles. One of the changes involves the complexity, as well as the power usage, of the various electrical systems within automobiles, particularly alternative fuel vehicles, such as hybrid, electric, and fuel cell vehicles.

Such vehicles often use electrochemical power sources, such as batteries, ultracapacitors, and fuel cells, to power the electric motors that drive the wheels, sometimes in addition to another power source, such as an internal combustion engine. An important parameter in the operation of vehicles that utilize batteries is the "state of charge" (SOC). The state of charge refers to the stored energy in the battery that is available to be used at any given time relative to the stored energy that is available when the battery is fully charged. An accurate determination of the state of charge allows for the vehicles to maximize performance and efficiency while minimizing emissions.

A conventional approach for batteries is to relate either a measured or calculated open circuit voltage to the state of charge. This is feasible because the open circuit voltage, which is the resting voltage of the battery when no load is applied, generally exhibits some observable dependence on the battery's state of charge. There are batteries, however, such as nickel metal hydride and some types of lithium ion batteries, which possess a nearly constant open circuit voltage across most of the range of state of charge. In other words, the open circuit voltage reveals nothing about the state of charge of the battery. Therefore, while these batteries are highly desirable as power sources for electric and hybrid vehicles because of their low mass, high power capability, and large energy storage capacity, they present a problem with regard to control because it is very difficult to estimate their state of charge with any degree of certainty.

Accordingly, it is desirable to provide a method and a system for determining the state of charge of a battery that is not based on its open circuit voltage. Furthermore, other desirable features and characteristics of the present invention will become apparent from the subsequent detailed description and the appended claims, taken in conjunction with the accompanying drawings and the foregoing technical field and background.

SUMMARY OF THE INVENTION

A method for determining a state of charge of a battery is provided. A magnetic force between the battery and a magnet is detected. The state of charge of the battery is determined based on the detected magnetic force.

A method for determining a state of charge of an automotive battery is provided. A magnetic force between the automotive battery and a magnet is detected. A magnetic property of the automotive battery is determined based on the detected magnetic force between the battery and the magnet and the strength of the field emanating from the magnet. The state of charge is determined based on the magnetic property.

An automotive drive system is provided. The automotive drive system includes an electric motor, a battery coupled to the electric motor, a sensor including a magnet, and a processor in operable communication with the sensor. The sensor is arranged and configured to detect a magnetic force between the battery and the magnet and generate a signal representative thereof. The processor is configured to receive the signal representative of the magnetic force from the sensor and determine the state of charge of the battery based on the detected magnetic force.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The following description refers to elements or features being "connected" or "coupled" together. As used herein, "connected" may refer to one element/feature being directly joined to (or directly communicating with) another element/feature, and not necessarily mechanically. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment. It should also be understood that FIGS. 1-7 are merely illustrative and may not be drawn to scale.

FIG. 1 to FIG. 7 illustrate a method and system for determining the state of charge of a battery. In one embodiment, the battery is within an automobile, such as a hybrid or fuel cell vehicle. A magnetic property, such as magnetic susceptibility, of the battery is determined by observing the magnetic force between the battery and a magnet. As the state of charge of the battery changes, the magnetic susceptibility, and thus the magnetic force, changes. A look-up table may be used to determine the state of charge based on the observed magnetic force.

Figure 1:
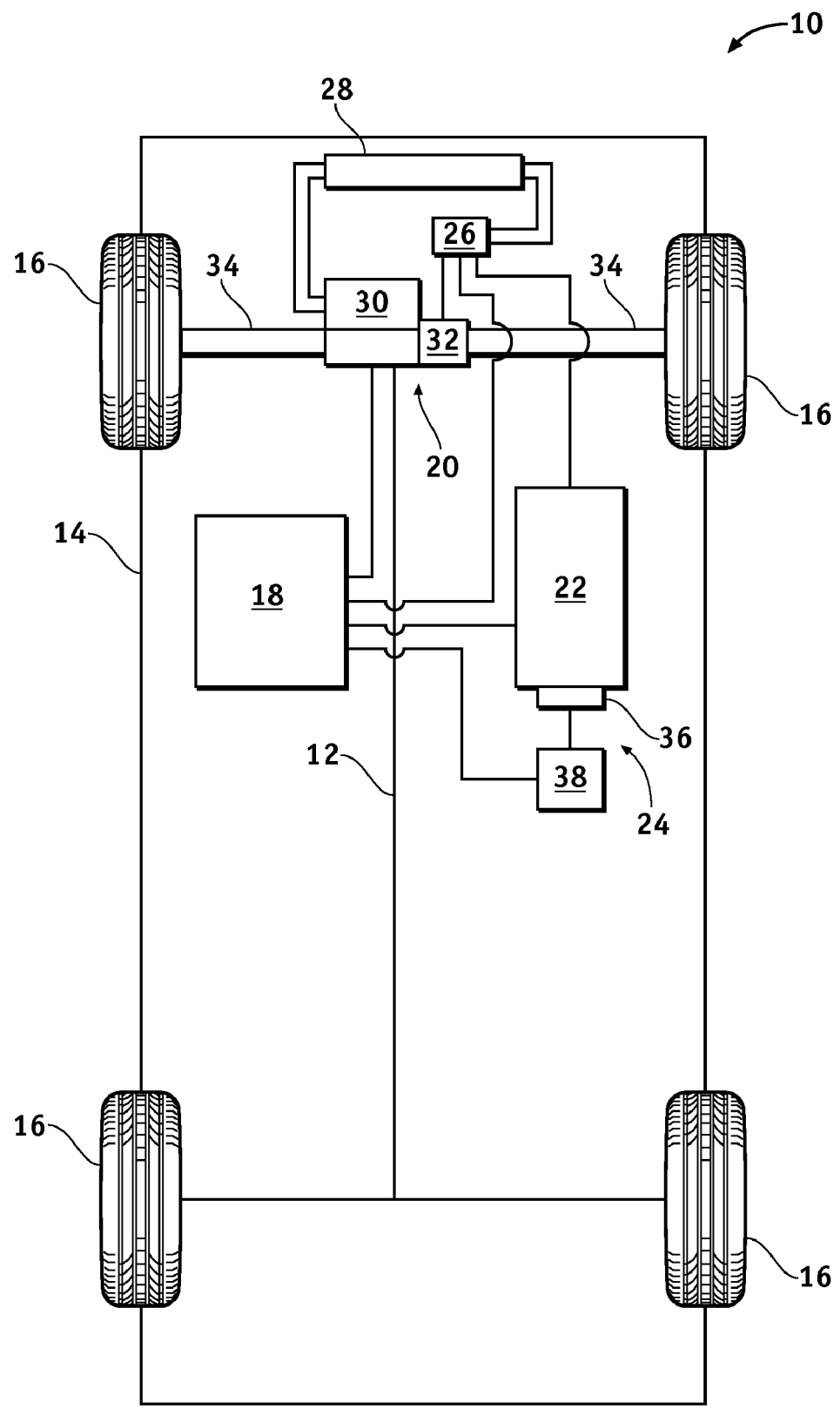
FIG. 1 is a schematic view of an exemplary automobile according to one embodiment of the present invention.

FIG. 1 illustrates a vehicle, or automobile, 10 according to one embodiment of the present invention. The automobile 10 includes a chassis 12, a body 14, four wheels 16, and an electronic control system (or electronic control unit (ECU)) 18. The body 14 is arranged on the chassis 12 and substantially encloses the other components of the automobile 10. The body 14 and the chassis 12 may jointly form a frame. The wheels 16 are each rotationally coupled to the chassis 12 near a respective corner of the body 14.

The automobile 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD). The automobile 10 may also incorporate any one of, or combination of, a number of different types of engines (or actuators), such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, or a fuel cell, a combustion/electric motor hybrid engine, and an electric motor.

In the exemplary embodiment illustrated in FIG. 1, the automobile 10 is a hybrid vehicle, and further includes an actuator assembly (or powertrain) 20, a battery 22, a battery state of charge (SOC) system 24, a power inverter (or inverter) 26, and a radiator 28. The actuator assembly 20 includes an internal combustion engine 30 and an electric motor/generator (or motor) system (or assembly) 32. The battery 22 is electrically connected to the inverter 26 and, in one embodiment, is a lithium ion (Li-ion) battery including a plurality of cells, as is commonly understood.

Although not illustrated, the power inverter 26 may include a plurality of switches, or transistors, as is commonly understood. The electric motor system 32, in one embodiment, includes one or more sinusoidally-wound, three-phase alternating current (AC) motor/generators (or motors) (e.g., permanent magnet) such as commonly used in automotive vehicles (e.g., traction drive control systems and the like). As will be appreciated by one skilled in the art, each of the electric motors includes a stator assembly (including conductive coils), a rotor assembly (including a ferromagnetic core), and a cooling fluid (i.e., coolant). The stator assembly and/or the rotor assembly within the electric motors may include multiple (e.g., sixteen) electromagnetic poles, as is commonly understood.

Still referring to FIG. 1, and as described in greater detail below, the combustion engine 30 and the electric motor system 32 are integrated such that both are mechanically coupled to at least some of the wheels 16 through one or more drive shafts 34. The radiator 28 is connected to the frame at an outer portion thereof and although not illustrated in detail, includes multiple cooling channels throughout that contain a cooling fluid (i.e., coolant) such as water and/or ethylene glycol (i.e., "antifreeze) and is coupled to the engine 30 and the inverter 26. The inverter 26 receives and shares coolant with the electric motor 32. The radiator 28 may be similarly connected to the inverter 26 and/or the electric motor 32.

Figure 2:
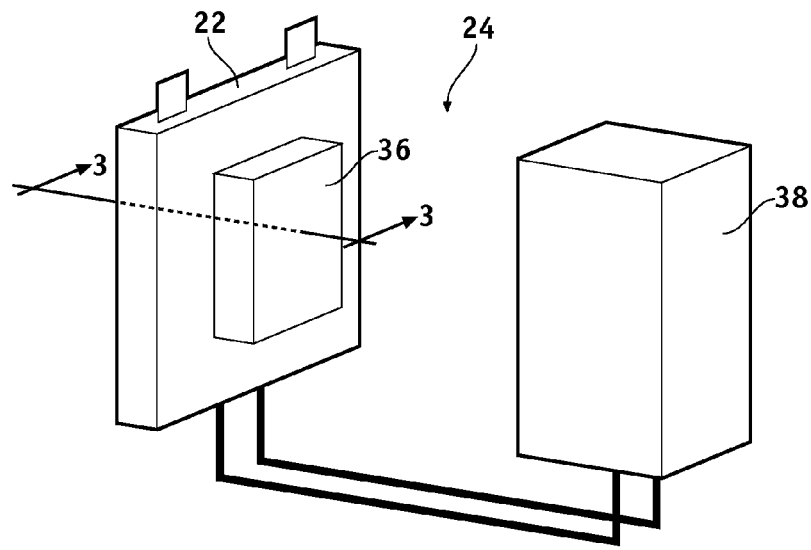
FIG. 2 is an isometric view of a state of charge (SOC) system within the automobile of FIG. 1.

Referring to FIGS. 1 and 2 in combination, the SOC system 24 includes a magnetic sensor 36 and a SOC module 38. The magnetic sensor 36 is located adjacent (or connected to) the battery 22 (or more particularly, one cell of the battery 22). The SOC module 38 is in operable communication with the magnetic sensor 36 and in one embodiment includes at least one processor and/or a memory that includes data relating a magnetic property of the battery 22 to the state of charge of the battery 22, as is described in greater detail below. Although not illustrated as such, the SOC module 38 may be integral with the electronic control system 18.

Figure 3:
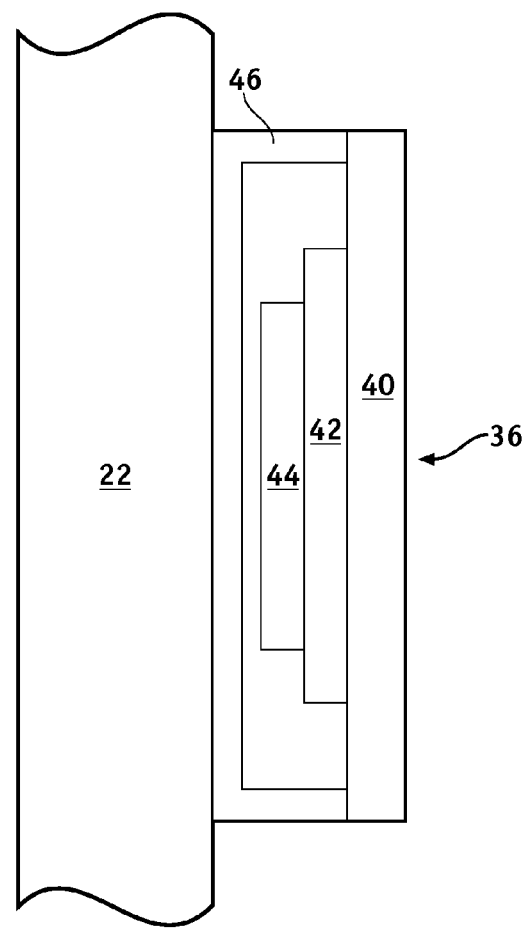
FIG. 3 is a cross-sectional side view of a battery and a magnetic sensor in the SOC system of FIG. 2 taken along line 3-3.

FIG. 3 illustrates the magnetic sensor 36 in greater detail, along with a portion of the battery 22. In the depicted embodiment, the magnetic sensor 36 includes a substrate 40, a strain gauge 42, a permanent magnet 44, and a casing 46. The strain gauge 42 is mounted to the substrate 40, and the permanent magnet 44 is positioned on the strain gauge 42. The casing 46 is secured to the substrate 40, shaped to enclose the strain gauge 42 and the permanent magnet 44, and may be made of an insulating material, such as a plastic.

Referring again to FIG. 1, the electronic control system 18 is in operable communication with the actuator assembly 20, the battery 22, the SOC system 24, and the inverter 26. Although not shown in detail, the electronic control system 18 includes various sensors and automotive control modules, or electronic control units (ECUs), such as a body control module (BCM) 19, and at least one processor and/or a memory which includes instructions stored thereon (or in another computer-readable medium) for carrying out the processes and methods as described below.

During operation, still referring to FIG. 1, the automobile 10 is operated by providing power to the wheels 16 with the combustion engine 30 and the electric motor assembly 32 in an alternating manner and/or with the combustion engine 30 and the electric motor assembly 32 simultaneously. In order to power the electric motor assembly 30, DC power is provided from the battery 22 to the inverter 26, which converts the DC power to AC power, prior to energizing the electric motor 32.

As will be appreciated by one skilled in the art, at various stages of operation, it is beneficial to have an accurate estimate of the state of charge of the battery 22, particularly in an embodiment using a lithium ion battery. According to one embodiment of the present invention, the magnetic sensor 36 detects, or senses, a magnetic property of the battery 22. The SOC module 38 (and/or the electronic control system 18) then determines the state of charge of the battery 22 based, at least in part, on the magnetic property. In one embodiment, the magnetic property is magnetic susceptibility which is determined by detecting a magnetic force between the battery 22 and the magnet 44.

Magnetic susceptibility describes the extent to which a material becomes magnetized in the presence of an applied magnetic field. The magnetic susceptibility per unit volume of the material, $\chi_v$, is given by the equation $$\chi_v = \frac{M}{H}, \qquad (1)$$

where M is the magnetization expressed as the magnetic dipole per unit volume, and H is the applied magnetic field. Susceptibility may also be expressed per unit mass or per mole of the material. If $\chi$ is positive, the material is attracted to the field and is described as being "paramagnetic." If $\chi$ is negative, the material is repelled by the field and is described as being "diamagnetic."

Generally, magnetism arises from both the localized spin of electrons and their orbital motion within atoms. Magnetic susceptibility is observed in free ions of the iron-group series, actinide-series, and rare-earth series elements on the periodic table. Compounds incorporating these elements also exhibit susceptibility, and some of these compounds find use as active materials for electrochemical energy storage in batteries. They belong to a class known as intercalation compounds, which are characterized by the ability to have small ions (such as Li) readily inserted into and withdrawn from their solid-state structures. This behavior provides for the charge and discharge processes of the batteries. An example of such a compound presently being considered for use as a cathode in lithium ion batteries is iron phosphate (FePO$_4$). The relevant electrochemical reaction is

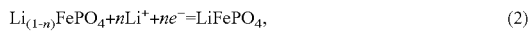

$$\text{Li}_{(1-n)}\text{FePO}_4 + n\text{Li}^+ + ne^- = \text{LiFePO}_4, \quad (2)$$

where n is the fraction of total available intercalation sites that are occupied. During discharge of the battery, lithium is inserted into the iron phosphate, and while the battery is being charged, lithium is removed.

When the free atoms, iron (Fe), phosphorous (P), and oxygen (O), in iron phosphate join, the individual electronic structures are modified to become part of the larger compound. The valence electrons of each atom contribute to bonding within the compound and charge transfer occurs among the atoms. The new electronic structure that is formed is characteristic of the specific compound and has a unique magnetic susceptibility associated with it. Further modification of the electronic structure occurs when more ions are introduced to the compound, as would be the case with insertion of lithium into the iron phosphate electrode during discharge of a lithium ion battery. This change has a measurable effect on the susceptibility of the electrode in proportion to the amount lithium added. By systematically varying the fraction of lithium in the electrode, n, and measuring the corresponding susceptibility, $\chi$, it is possible to establish a relationship between the two variables. By simply multiplying n by 100, the relationship between susceptibility and percent state of charge is obtained. Embodiments of the present invention utilize the dependence of susceptibility to determine the state of charge of the battery.

Figure 4:
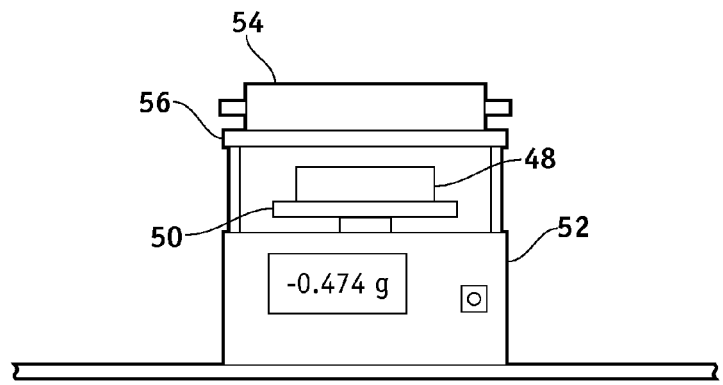
FIG. 4 is a side view of an experimental set up for determining a state of charge of a battery in accordance with one embodiment of the present invention.

FIG. 4 illustrates an experimental set up (i.e., a Gouy balance arrangement) that may be used to measure susceptibility effects in a battery cell. A permanent magnet 48 is placed on the pan 50 of an electronic balance 52. The balance reading is initially set to zero. A battery, or battery cell, 54 is then placed on a support 56 directly above the magnet 48. If the cell 54 is repelled by the magnet 48, the balance indicates an apparent increase in the mass of the magnet 48. Conversely, if the cell 54 is attracted to the magnet 48, the balance 52 indicates an apparent decrease in the mass of the magnet 48. The cell 54 is then connected to a battery charger, or "cycler," (not shown) to adjust and measure the state of charge of the cell 54 (i.e., charge or discharge the cell 54). The corresponding change in magnetic susceptibility manifests as a change in apparent mass, or the force exerted by the magnet 48 on the balance 52.

Figure 5:
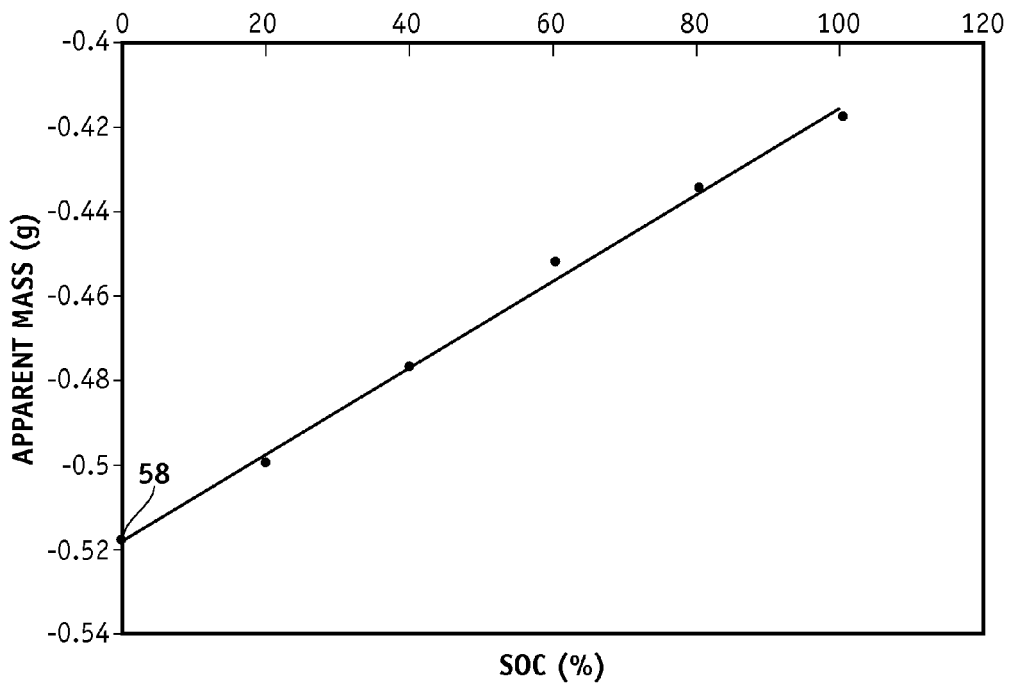
FIG. 5 is a graph comparing an apparent mass of a magnet to the state of charge of a battery in the experimental set up of FIG. 4.

Thus, a graph (or chart or table) of apparent mass (or force) vs. state of charge, such as that shown in FIG. 5, may be generated. Note that the initial apparent mass 58 (i.e., at 0% SOC) is negative, which indicates that an attractive force between the cell 54 and the magnet 48 in FIG. 4 is lifting the magnet 48 slightly from the pan 56. As the state of charge increases, the balance reading becomes less negative (i.e. the magnet 48 appears to become heavier, which indicates that attractive force is weakening. To convert this information to magnetic susceptibility vs. state of charge, the mass readings may be converted into force values and utilized in combination with the known strength of the field emanating from the magnet.

However, in at least one embodiment of the present invention, a direct determination of magnetic susceptibility is not required, and the apparent mass described above, a considerably more directly attainable parameter, may be used. The SOC module 38 stores in a look-up table format the relationship between the susceptibility and the battery state of charge, similar to the data shown in FIG. 5. The data in the look-up table is taken from laboratory experiments performed on representative batteries across the range of expected operating temperatures. Algorithms for controlling the hardware, deciding when to make measurements, and processing the signal from the hardware may also be stored in the SOC module 38.

Referring again to FIG. 3, the magnetic sensor 36 operates using a similar principle to that shown in FIG. 4. As the state of charge of the battery 22 changes, the force exerted between the battery 22 and the magnet 44 (either repulsive or attractive) changes in a manner similar to that demonstrated in FIG. 5. The strain gauge 42 detects and generates a signal representative of these changes that is provided to the SOC module 38, which uses the look-up table stored therein to determine the current state of charge of the battery 22. In at least one embodiment, the state of charge is determined without using the voltage of the battery 22.

The magnetic force and/or state of charge may be measured continuously throughout operation, or if electromagnetic interference makes this impractical, it may be measured at times when there is little or no current flowing in the battery 22. For hybrid (or electric) vehicle batteries, it may be preferable to take measurements while the automobile 10 is off, or just after the ignition is activated.

In one embodiment, whenever current is within acceptable limits and a valid susceptibility measurement becomes available, the corresponding state of charge (or a magnetic portion of the state of charge), SOC$_\chi$, is retrieved from the look-up table and is blended as a correction signal with a current associated with the battery, such as an amp-hour-based state of charge (or a current portion of the state of charge), SOC$_{Ah}$, which may correspond in an integration of the current flow through the battery 22. The blending is performed in a manner such that the weighting of the susceptibility-based state of charge (SOC$_\chi$) is greatest at the point at which the measurement occurs, then diminishes as a function of the amp-hour throughput ($\Delta$Ah) that the battery experiences. This is achieved through the use of a variable weight factor, w, in the blending equation $$SOC = wSOC_\chi + (1-w)SOC_{Ah}, \quad (3)$$

where w is a function of $\Delta$Ah. The amp-hour-based state of charge is calculated continuously whenever current is flowing through the battery 22 in either the SOC module 38, or another, remote microprocessor which transmits the value over a vehicle communication bus.

The amp-hour-based state of charge is calculated according to the equation $$SOC_{Ah} = SOC_{t-\Delta t} + \frac{I\Delta t}{Ah_{nominal}} \times 100, \quad (4)$$

where I is current, $\Delta$t is the time interval of the calculation, and Ah$_{nominal}$ is the rated capacity of the battery. Note that the incremental change in SOC$_{Ah}$, $$\frac{I\Delta t}{Ah_{nominal}} \times 100,$$

is added to the blended SOC from the previous time step, $SOC_{t-\Delta t}$. In this manner, the calculation of $SOC_{Ah}$ may always incorporate any correction that has been provided by $SOC_\chi$. By allowing the influence of $SOC_\chi$ to decay by means of the weight factor w, the reported state of charge is not unduly biased by data that is too old to be applicable. Other methods of calculating state of charge based on current (and/or voltage) are known in the art, such as those described in U.S. Pat. No. 6,639,385, and may be utilized in other embodiments of the present invention in combination with the methods described herein.

Figure 6:
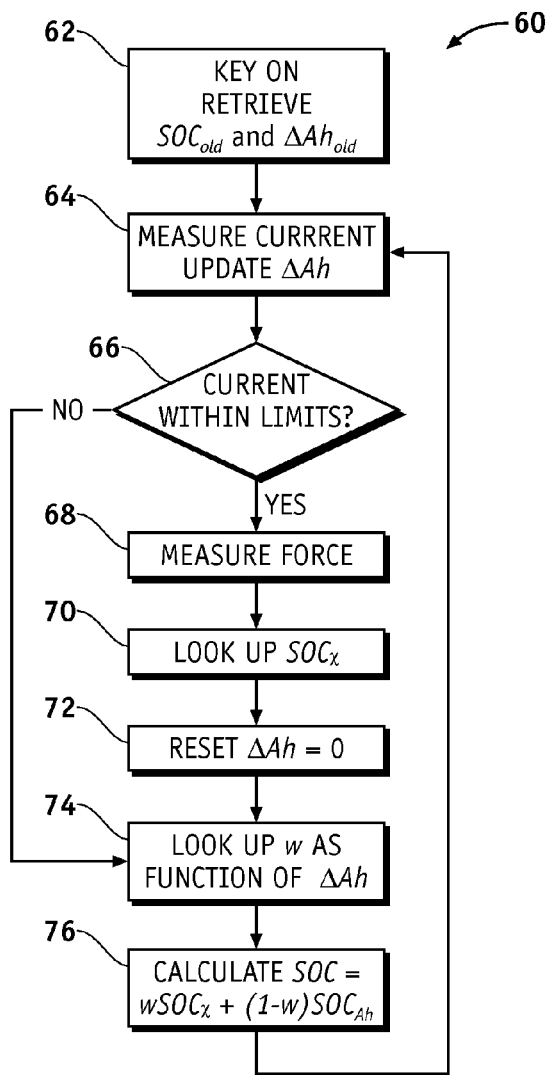
FIG. 6 is a flow chart of a method for determining a state of charge of a battery according to one embodiment of the present invention.

FIG. 6 illustrates a method 60 for determining a state of charge, according to one embodiment of the present invention. The series of steps 62-76 may occur continuously at intervals of one second or less whenever the automobile 10 is turned on.

The method 60 begins at step 62 when the vehicle key is turned on (e.g., when the ignition is activated), and values of state of charge ($SOC_{old}$) and amp-hour throughput ($\Delta Ah_{old}$) that were stored when the vehicle last powered down are retrieved from non-volatile memory. At step 64, current is measured and the amount of energy that has passed through the battery since the magnetic susceptibility ($\chi$) was last determined ($\Delta Ah$) is updated. At step 66, a test is performed to determine whether the current flow through the battery pack is low enough (i.e., within a preset limit stored in the SOC module 38) such that it will not interfere with the magnetic sensor 36. If this condition is met, the magnetic force between the battery 22 and the magnet 44 is measured at step 68 and converted to a susceptibility-based state of charge ($SOC_\chi$) by means of the look-up table stored in the SOC module 38 (FIG. 2) at step 70. Then, at step 72, $\Delta Ah$ is reset to zero.

Figure 7:
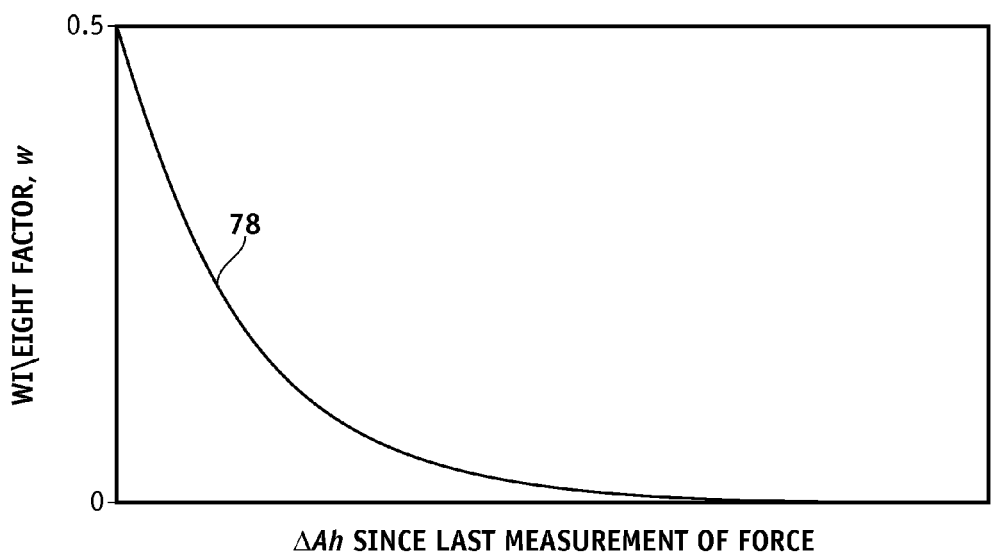
FIG. 7 is a graph comparing a weight factor to a current flow through a battery used in the method of FIG. 6.

At step 74, the weight factor (w) for the contribution of $SOC_\chi$ to the blended state of charge is taken from a look-up table which describes a relationship between w and $\Delta Ah$. An example of such a table is shown in FIG. 7. Note that if $\Delta Ah$ has just been reset to zero, w will take on its maximum value as indicated by the exponential decay of was shown by line 78. At step 76, the blended state of charge is calculated using the weight factor determined in step 74 (e.g., 0.5). The method 60 then loops back to step 64 and is repeated.

At step 66, if the current is not within the preset limits, the method 60 bypasses steps 68, 70, and 72 and proceeds with step 74. For each successive loop through the process for which the current condition fails to be met, the value of $\Delta Ah$ will increment due to the operation of the automobile 10, and the corresponding value of w retrieved from the look-up table decreases according to FIG. 7. In this manner, the influence of $SOC_\chi$ on state of charge is prominent whenever the current condition is met, and fades during periods when the current condition is not met.

One advantage of the method and system described above is that because the state of charge of the battery is determined without using the voltage of the battery, the use of batteries with relatively invariant open circuit voltage, such as some lithium ion batteries, is facilitated. Another advantage is that because of the weighting scheme described above, the magnetic state of charge is always supplemented by the current-based state of charge. Thus, the accuracy of the state of charge calculation is improved.

Other embodiments may be directed towards sensing or detecting magnetic properties of the battery other than magnetic susceptibility, such as magnetization, magnetic moments, and magnetic permeability with any type of sensor capable of sensing the property. The method and system may be used in vehicles other than automobiles, including aircraft and watercraft, as well as other types of electrical systems utilizing electrochemical power sources, such as computing systems. An electromagnet or any device capable of generating field that stimulates a magnetic response in the battery may be used instead of the permanent magnet shown. Other methods for combining the magnetic portion and the current portion of the state of charge may be used. It is also possible for voltage-based methods to be combined with the magnetic-based state of charge.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for determining a state of charge of a battery comprising:
    detecting a magnetic force between the battery and a magnet; and
    determining the state of charge of the battery based on the detected magnetic force.

2. The method of claim 1, further comprising calculating a current associated with the battery and wherein the determining the state of charge is further based on the current.

3. The method of claim 2, wherein the current associated with the battery corresponds to an amount of current flow through the battery.

4. The method of claim 3, wherein the determining the state of charge of the battery further comprises:
    determining a magnetic portion of the state of charge based on the magnetic force;
    determining a current portion of the state of charge based on the current; and
    weighting the magnetic portion of the state of charge and the current portion of the state of charge such that as the current flow through the battery increases, influence on the state of charge by the magnetic portion is decreased.

5. The method of claim 1, wherein the magnetic force is an attractive magnetic force.

6. The method of claim 1, wherein the determining of the state of charge of the battery further comprises generating a table of magnetic force values and state of charge values associated with the magnetic force values.

7. The method of claim 1, wherein the battery is an automotive battery.

8. The method of claim 7, wherein the battery is a lithium ion battery.

9. The method of claim 5, wherein as the state of charge of the battery increases, the attractive magnetic force between the battery and the magnet is reduced.

10. The method of claim 1, wherein the magnet is a permanent magnet and the magnetic force is detected with a strain gauge.

11. A method for determining a state of charge of an automotive battery comprising:
    detecting a magnetic force between the automotive battery and a magnet;
    determining a magnetic property of the automotive battery based on the detected magnetic force; and
    determining the state of charge of the automotive battery based on the magnetic property.

12. The method of claim 11, wherein the determining of the state of charge is further based on an integration of current flowing through the battery with respect to time, and the determining the state of charge of the battery further comprises:
    determining a magnetic portion of the state of charge based on the magnetic property;
    determining a current portion of the state of charge based on the integration of current; and
    weighting the magnetic portion of the state of charge and the current portion of the state of charge such that as the current flow through the battery increases, influence on the state of charge by the magnetic portion is decreased.

13. The method of claim 12, wherein the battery is a lithium ion battery.

14. The method of claim 13, wherein the determining the state of charge of the automotive battery is not based on a voltage of the automotive battery.

15. The method of claim 14, wherein the magnetic property is magnetic susceptibility.

16. The method of claim 1, wherein the detecting step includes detecting the magnetic force between the battery and the magnet with a magnetic sensor adjacent to the battery.

17. The method of claim 1, wherein the detecting step includes detecting the magnetic force between the battery and the magnet with a magnetic sensor comprising a substrate, a strain gauge mounted on the substrate, and the magnet mounted on the strain gage.

18. The method of claim 1, wherein the detecting step includes detecting the magnetic force between the battery and the magnet with a magnetic sensor comprising a substrate, a strain gauge mounted on the substrate, the magnet mounted on the strain gage, and a casing formed from an insulating material and enclosing the strain gauge and the magnet.

\* \* \* \* \*